United States Patent
Oda

(10) Patent No.: US 8,033,675 B2
(45) Date of Patent: Oct. 11, 2011

(54) LIGHT EMITTING DEVICE AND ELECTRONIC DEVICE

(75) Inventor: Toshihiro Oda, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/907,373

(22) Filed: Oct. 19, 2010

(65) Prior Publication Data

US 2011/0096540 A1  Apr. 28, 2011

(30) Foreign Application Priority Data

Oct. 27, 2009  (JP) .................................. 2009-246364

(51) Int. Cl.
*F21V 9/16* (2006.01)
(52) U.S. Cl. ...................... 362/84; 362/231; 362/249.02; 362/249.04; 362/297; 362/311.02; 313/504
(58) Field of Classification Search .................. 362/227, 362/230–231, 234–235, 247, 253, 296.01, 362/297, 311.02, 800, 84, 249.02, 249.04; 313/112–114, 498, 505–507, 512, 504
See application file for complete search history.

(56) References Cited

U.S. PATENT DOCUMENTS

| 5,554,911 A | 9/1996 | Nakayama et al. |
| 7,045,949 B2 | 5/2006 | Yamada et al. |

FOREIGN PATENT DOCUMENTS

| JP | B2-2797883 | 9/1998 |
| JP | B2-3555759 | 8/2004 |

*Primary Examiner* — Stephan F Husar
*Assistant Examiner* — Meghan Dunwiddie
(74) *Attorney, Agent, or Firm* — Oliff & Berridge, PLC

(57) ABSTRACT

A light emitting device has a plurality of light emitting elements each having a first electrode layer, a second electrode layer, and a light emitting layer disposed between the first and the second electrode layers, a reflective layer being disposed between a substrate and the first electrode layer and reflecting light emitted by the light emitting layer to the light emitting layer, the light emitting elements including a red light emitting element that emits a red light, a green light emitting element that emits a green light, and a blue light emitting element that emits a blue light, the green and the blue light emitting elements each having a resonator structure which contains the reflective layer and a translucent half-reflective layer and which is constituted by adjustment of the optical distance between the reflective layer and the translucent half-reflective layer, the red light emitting element not having the resonator structure.

7 Claims, 5 Drawing Sheets

EXPERIMENTAL EXAMPLE

| θ [deg] | | 0 | 15 | 30 | 45 | 60 | 75 |
|---|---|---|---|---|---|---|---|
| COLOR PURITY | CIE1931x | 0.667 | 0.666 | 0.664 | 0.660 | 0.657 | 0.655 |
| | CIR1931y | 0.332 | 0.333 | 0.336 | 0.339 | 0.342 | 0.344 |
| PEAK WAVELENGTH [nm] | | 622.2 | 621.6 | 620.3 | 618.6 | 617.6 | 616.9 |
| STANDARDIZED LUMINANCE | | 1.000 | 0.979 | 0.892 | 0.696 | 0.418 | 0.145 |

COMPARATIVE EXAMPLE

| θ [deg] | | 0 | 15 | 30 | 45 | 60 | 75 |
|---|---|---|---|---|---|---|---|
| COLOR PURITY | CIE1931x | 0.671 | 0.668 | 0.658 | 0.645 | 0.638 | 0.636 |
| | CIR1931y | 0.329 | 0.332 | 0.342 | 0.354 | 0.361 | 0.362 |
| PEAK WAVELENGTH [nm] | | 622.2 | 620.1 | 615.1 | 610.3 | 609.5 | 610.5 |
| STANDARDIZED LUMINANCE | | 1.000 | 0.992 | 0.870 | 0.528 | 0.205 | 0.050 |

FIG. 4

LIGHT EMITTING DEVICE AND ELECTRONIC DEVICE

TECHNICAL FIELD

The present invention relates to a light emitting device and an electronic device containing organic EL (electro luminescent) elements and the like.

RELATED ART

As thin and lightweight light emitting sources, OLED (organic light emitting diode), i.e., an organic EL (electro luminescent) element, has drawn attention, and image display devices having a large number of EL elements have been developed. The organic EL elements have a structure such that at least one layer of organic thin film formed with organic materials is sandwiched between a pixel electrode and a counter electrode.

In the field of the organic EL elements, a technique for strengthening a light having a specific wavelength among emitted lights utilizing amplification interference, i.e., resonance, is known. In order to produce a resonance phenomenon, a reflective layer and a translucent half-reflective layer ("translucent" for taking out light) are utilized. This technique can increase the color purity of the color of the emitted light or the efficiency of the light to be emitted to light emission.

Such image display devices, image display devices described in Japanese Patent Nos. 2797883 and 3555759, for example, are known.

However, the techniques described in Japanese Patent Nos. 2797883 and 3555759 or techniques for strengthening light having a specific wavelength by an optical resonator have the following problems.

More specifically, according to the technique of Japanese Patent Nos. 2797883 and 3555759, a light having a specific wavelength can be surely strengthened by the action of a "micro optical resonator" ([0015], [0018], and the like of Japanese Patent No. 2797883) but the technique has a problem in that the degrees of advantages and disadvantages obtained by strengthening the light vary depending on the color to be strengthened. For example, considering the case where each of three color lights of red, green, and blue colors is strengthened by an optical resonator, the green light and the blue light among the lights relatively easily enjoy an light extraction efficiency improvement effect or a color purity improvement effect as the advantages and deterioration of viewing angle characteristics as the disadvantages is not noticeable. However, the same does not always apply to the red light. More specifically, although the light extraction efficiency improvement effect or the color purity improvement effect can be expected to some extent, the deterioration of the viewing angle characteristics exceeding the improvement is noticeable. On the whole, a significance for producing the resonance phenomenon in the red light is hard to accept compared with the cases of the green light and the blue light.

SUMMARY

An advantage of some aspects of the invention is to provide a light emitting device and an electronic device that can solve at least one part of the above-described problems.

In order to solve the above-described problems, a light emitting device according to a first aspect of the invention has two or more light emitting elements having a first electrode layer, a second electrode layer, and a light emitting layer disposed between the first and the second electrode layers, a reflective layer that reflects a light emitted by the light emitting layer to the light emitting layer, and a translucent half-reflective layer disposed opposite to the reflective layer with the light emitting layer interposed therebetween, reflects some of lights emitted by light emitting layer to the light emitting layer, and transmits the remaining lights, in which the light emitting elements include a red light emitting element that emits a red light, a green light emitting element that emits a green light, and a blue light emitting element that emits a blue light, the optical distance from the reflective layer relating to the red light emitting element to the interface facing the reflective layer in the translucent half-reflective layer is defined based on $d_R$ calculated by Equation (i), $$d_R = (\phi_{DR} + \phi_{UR})/4\theta) \cdot \lambda_R \qquad (i)$$

wherein $\lambda_R$ represents a red light wavelength, $\phi_{DR}$ represents a phase change when a light having a wavelength $\lambda_R$ that proceeds to the reflective layer from the light emitting layer side reflects on the reflective layer, and $\phi_{UR}$ represents a phase change when a light having a wavelength $\lambda_R$ that proceeds to the translucent half-reflective layer from the light emitting layer side reflects on the translucent half-reflective layer.

According to the first aspect of the invention, with respect to the light emitting element that emits a red light, an optical resonator in terms of satisfying Equation (ii) described later is not constituted. However, Equation (i) above is in agreement with the case where m in Equation (ii) is 0. With respect to the light emitting element, a kind of resonance conditions is established in such a meaning. Thus, according to the aspect of the invention, so-called perfect resonance conditions are not established but a certain light extraction efficiency improvement effect or a certain color purity improvement effect can be obtained. In addition, according to the aspect of the invention, with respect to the light emitting element that emits a red light, the fact that the resonance conditions are not satisfied does not change, and thus the viewing angle characteristics are improved.

The "red light wavelength" in the invention does not refer to only one value. Typically, $\lambda_R = 610$ [nm] is a preferable example as described in an embodiment described later, but $\lambda_R = 600$ [nm], $\lambda_R = 620$ [nm], etc., may be set in addition to the above.

The light emitting device according to the aspect of the invention may be structured such that the optical distance from the reflective layer relating to each of the green light emitting element and the blue light emitting element to the interface facing the reflective layer in the translucent half-reflective layer is defined based on d calculated by Equation (ii), $$D = (2\pi m + \phi_D + \phi_U)/4\pi) \cdot \lambda \qquad (ii),$$

wherein $\lambda$ represents a wavelength to be set as a resonance target, (OD represents a phase change when a light having a wavelength $\lambda$ that proceeds to the reflective layer from the light emitting layer side reflects on the reflective layer, $\phi_U$ is a phase change when a light having a wavelength $\lambda$ that proceeds to the translucent half-reflective layer from the light emitting layer side reflects on the translucent half-reflective layer, and m represents a positive integer.

According to this aspect, a resonance phenomenon can be preferably produced in the resonator structure containing a light emitting element, a reflective layer, and a translucent half-reflective layer. As described above, with respect to the light emitting element that emits a green light or a blue light, advantages in employing the resonator structure is larger than disadvantages in employing the resonator structure. Thus, producing differences in handling between the green and blue light emitting elements and the red light emitting elements brings preferable effects from the viewpoint of the whole light emitting device as in this aspect.

In order to solve the above-described problems, a light emitting device according to a second aspect of the invention has two or more light emitting elements having a first electrode layer, a second electrode layer, and a light emitting layer disposed between the first and the second electrode layers, a reflective layer that reflects a light emitted by the light emitting layer to the light emitting layer, and a translucent half-reflective layer disposed opposite to the reflective layer with the light emitting layer interposed therebetween, reflects some of lights emitted by light emitting layer, and transmits the remaining lights, in which the light emitting elements include a red light emitting element that emits a red light, a green light emitting element that emits a green light, and a blue light emitting element that emits a blue light, the optical distance from the reflective layer relating to the blue light emitting element to the interface facing the reflective layer in the translucent half-reflective layer is defined based on d calculated by Equation (iii), and the optical distance from the reflective layer relating to the red light emitting element to the interface facing the reflective layer in the translucent half-reflective layer is set to be smaller than d, $$d = (2\pi + \phi_D + \phi_U)/4\theta) \cdot \lambda \qquad \text{(iii)},$$

wherein $\lambda$ represents a wavelength to be set as a resonance target, $\phi_D$ represents a phase change when a light having a wavelength $\lambda$ that proceeds to the reflective layer from the light emitting layer side reflects on the reflective layer, and $\phi_U$ represents a phase change when a light having a wavelength $\lambda$ that proceeds to the translucent half-reflective layer from the light emitting layer side reflects on the translucent half-reflective layer.

According to the aspect of the invention, with respect to the light emitting element that emits a blue light, resonance conditions in the case of m=1 in Equation (ii) above (i.e., Equation (iii) above) are established. Thus, with respect to the light emitting element, the intensity of a blue light having an appropriate wavelength substituted to $\lambda$ as a typical blue light becomes high.

In contrast, in the aspect of the invention, the light emitting element that emits a red light has an optical distance smaller than the optical distance d determined by Equation (iii). According to this, the resonance conditions established for the light emitting element that emits a blue light are primary resonance conditions (i.e., m=1) as described above and the wavelength of the blue light is shorter than the wavelength of the red light. Thus, for the light emitting element that emits a red light, resonance conditions are not usually established. Thus, the viewing angle characteristics for the light emitting element that emits a red light improve also in the aspect of the invention.

It is a matter of course that, in the aspect of the invention, resonance conditions satisfying Equation (ii) above may be established for the light emitting element that emits a green light.

The light emitting device of the above-described aspects of the invention may be structured such that an electron transporting layer is further disposed between the first and the second electrode layers and the electron-transporting layer and the second electrode layer are formed in common in all of the red light emitting element, the green light emitting element, and the blue light emitting element.

According to the aspect, since the electron-transporting layer and the second electrode layer are formed in common in all of the light emitting elements, the ease of manufacturing increases compared with the case where the respective layers are individually formed for every light emitting element. In the aspect of the invention, in spite of the fact that the light emitting element that emits a red light is constituted so that resonance conditions are not satisfied, the effect of the aspect can be obtained.

The light emitting device of the aspects of the invention may be structured such that the translucent half-reflective layer contains the second electrode layer and functions as a cathode.

According to this aspect, the translucent half-reflective layer contains all or a part of the second electrode layer, in other words, the translucent half-reflective layer and all or a part of the second electrode layer is used in common or used for a dual purpose, and thus an increase in efficiency and simplification of the device structure is achieved and ease of manufacturing increases.

In order to solve the above-described problems, a light emitting device according to a third aspect of the invention has two or more light emitting elements having a first electrode layer, a second electrode layer, and a light emitting layer disposed between the first and the second electrode layers and a reflective layer that is disposed between a substrate and the first electrode layer and reflects a light emitted by the light emitting layer to the light emitting layer, in which the light emitting elements include a red light emitting element that emits a red light, a green light emitting element that emits a green light, and a blue light emitting element that emits a blue light, the green light emitting element and the blue light emitting element have a translucent half-reflective layer that reflects some of lights emitted by the light emitting layer and transmits the remaining lights and have a resonator structure which contains the reflective layer and the translucent half-reflective layer and which is constituted by adjustment of the optical distance between the reflective layer and the translucent half-reflective layer, and the red light emitting element does not contain the resonator structure.

According to the aspect of the invention, the effects achieved by the invention according to the first and second aspects of the invention are achieved.

In the aspect of the invention, the light emitting element that emits a green color and the light emitting element that emits a blue light achieves the resonator structure by the establishment of the optical distance represented by Equation (ii) or the like between the reflective layer and the translucent half-reflective layer. However, the light emitting element that emits a red light is specified as a light emitting element not containing the resonator structure in such a definition. More specifically, in the aspect of the invention, measures for achieving the structure of "not containing" are not particularly limited. For example, the light emitting element that emits a red light can achieve the structure of "not containing the resonator structure" by providing a simple transparent layer instead of providing the translucent half-reflective layer. It is a matter of course that the other measures are acceptable.

Thus, aside from the measures, the resonator structure is employed for the light emitting element that emits a green light and the light emitting element that emits a blue light and the structure is not employed for the light emitting element that emits a red light. Thus, also in the aspect of the invention, the effects achieved by the invention according to the first and second aspects of the invention are achieved.

In order to solve the above-described problems, a light emitting device according to a fourth aspect of the invention has two or more light emitting elements having a first electrode layer, a second electrode layer, and a light emitting layer disposed between the first and the second electrode layers, a reflective layer that is disposed between a substrate and the first electrode layer and reflects a light emitted by the light emitting layer to the light emitting layer, and a translucent half-reflective layer disposed opposite to the reflective layer with the light emitting layer interposed therebetween, reflects some of lights emitted by light emitting layer, and transmits the remaining lights, in which the reflective layer and translucent half-reflective layer constitute a resonator structure through adjustment of the optical distance between both the layers, the light emitting elements include a red light emitting element that emits a red light, a green light emitting element that emits a green light, and a blue light emitting element that emits a blue light, the green light emitting element and the blue light emitting element contain the resonator structure, and the red light emitting element does not contain the resonator structure.

Also in the aspect of the invention, the effects achieved by the invention according to the first and second aspects of the invention are achieved similarly as in the third aspect of the invention. Also in the aspect of the invention, the red light emitting element is specified as a light emitting element not containing the resonator structure in the definition described for the third aspect of the invention. More specifically, also in the aspect of the invention, measures for achieving the structure of "not containing" are not particularly limited. For example, the light emitting element that emits a red light can achieve the structure of "not containing the resonator structure" by not adjusting the optical distance between the translucent half-reflective layer and the reflective layer so as to form the resonator structure although providing the translucent half-reflective layer. It is a matter of course that the other measures are acceptable.

In order to solve the above-described problems, an electronic device according to an eighth aspect of the invention has the light emitting devices described above.

Since the electronic device of the aspect of the invention has the light emitting devices described above, an electronic device that can enjoy the improvement effect of the viewing angle characteristics in the light emitting element that emits a red light is provided.

BRIEF DESCRIPTION OF THE DRAWINGS

The invention will be described with reference to the accompanying drawings, wherein like numbers reference like elements.

FIG. 4 is a view showing the experimental results of the viewing angle characteristics of the light emitting device of FIG. 1.

DESCRIPTION OF EXEMPLARY EMBODIMENTS

Figure 1:
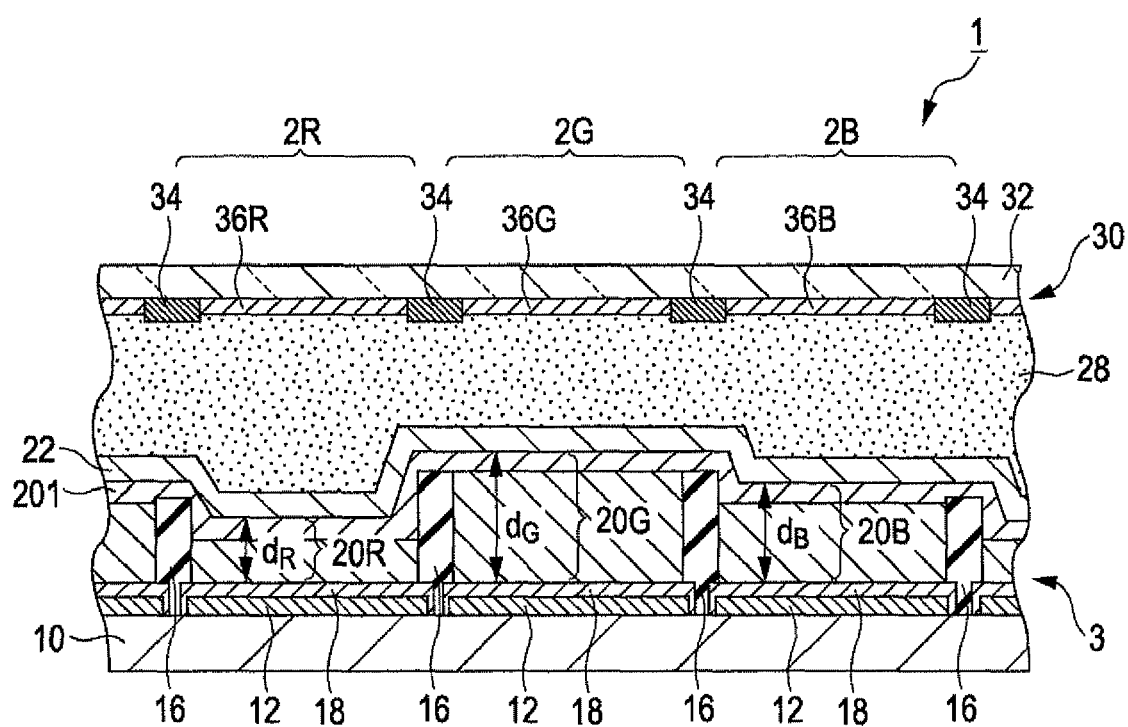
FIG. 1 is a cross sectional view showing the outline of a light emitting device according to an embodiment of the invention.

Hereinafter, embodiments of the invention will be described with reference to FIGS. 1 and 2. In addition to FIGS. 1 and 2 mentioned here, the ratio of the dimension of each part is sometimes made different from the actual dimension as appropriate in each drawing referred to below. Cross-sectional structure of organic EL device FIG. 1 is a cross sectional view showing the outline of an organic EL device (light emitting device) 1 according to an embodiment of the invention. The organic EL device 1 has a light emitting panel 3 and a color filter panel 30.

The light emitting panel 3 has two or more light emitting elements (pixels) 2 (2R, 2G, 2B) as shown in FIG. 1. The organic EL device 1 of this embodiment is used as a full color image display device. The light emitting element 2R is a light emitting element in which the color of emitted light is red and the light emitting elements 2G and 2B are light emitting elements in which the color of emitted light is green or blue, respectively.

To each of the light emitting elements 2, a TFT (thin film transistor) for power supply, wiring, and the like are connected. The TFT, wiring, and the like are built between appropriate interlayer insulation films on a substrate 10.

In FIG. 1, the TFT, wiring, and the like are not shown for ease of seeing and the like of the drawings (the interlayer insulation film can be formed at various positions, such as between a reflective layer 12 and a first electrode layer 18 described later or between the reflective layer 12 and the substrate 10 but is not shown). In FIG. 1, only the three light emitting elements 2 are shown but, in actual, a larger number of the light emitting elements 2 rather than the number of the light emitting elements 2 shown in FIG. 1 are provided. Hereinafter, the subscripts of the constituent elements, R, G, and B correspond to the light emitting elements 2R, 2G, and 2B.

The light emitting panel 3 shown in FIG. 1 is a top emission type. The light emitting panel 3 has the substrate 10. The substrate 10 may be formed with, for example, transparent materials, such as glass, and may be formed with, for example, opaque materials, such as ceramics or metals.

At the positions on the substrate 10 where at least the light emitting elements 2 are disposed, reflective layers 12 having a uniform thickness are formed. The reflective layers 12 are formed with materials having a high reflectance, such as Al (aluminum), Cr (chromium), Ag (silver), or an alloy containing the same, and reflect light (including light emission by the light emitting elements 2) that proceeds from the light emitting elements 2 to the upper side of FIG. 1.

To the reflective layers 12, Cu, Zn, Nd, Pd, and the like may be added, for example, in addition to Al, Cr, and Ag. Thus, an increase in heat resistance is expected.

The thickness of the reflective layers 12 is preferably about 50 to 150 nm.

On the substrate 10, separators 16 that separate the light emitting elements 2 are formed. The separators 16 are formed with, for example, insulating resin materials, such as acrylic, epoxy, or polyimide.

Each light emitting element 2 has the first electrode layer 18, a second electrode layer 22, and a light emitting functional layer 20 disposed between the first electrode layer 18 and the second electrode layer 22.

In this Embodiment, the first electrode layer 18 is a pixel electrode provided to each pixel (light emitting element 2) and is for example, an anode. The first electrode layer 18 is formed with, for example, transparent materials, such as ITO (indium tin oxide) or $ZnO_2$.

In this embodiment, the light emitting functional layers 20 (20R, 20G, 20B) are formed in such a manner as to correspond to each of the light emitting elements 2R, 2G, and 2B, respectively. The light emitting functional layers 20R, 20G, and 20B are different from each other in the thickness according to the color of the emitted lights. The optical distance d ($d_R$, $d_G$, $d_B$) between the reflective layer 12 and the second electrode layer 22 is different in each light emitting element 2R, 2G, and 2B. This aims at amplifying a light having a specific wavelength in each light emitting element 2. More specifically, a light having a red wavelength is amplified and emitted in the light emitting element 2R, a light having a green wavelength is amplified and emitted in the light emitting element 2G, and a light having a blue wavelength is amplified and emitted in the light emitting element 2B. In FIG. 1, d ($d_R$, $d_G$, $d_B$) represents the optical distance, and do not represent the actual distance. This respect will be described in detail in the section of <Light reflection and transmission model>described later.

The light emitting functional layers 20 each at least have an organic light emitting layer. For the above-described light emission of each color, organic EL substances to be included in this organic light emitting layer may be changed as appropriate. When a current flows into such an organic light emitting layer, lights having red, green, blue light components are emitted. The organic light emitting layers may be constituted by a single layer or two or more layers (e.g., a blue light emitting layer that mainly emits a blue light when a current flows and a yellow light emitting layer that emits a light containing a red color and a green color when a current flows).

The light emitting functional layer 20 may have, in addition to the organic light emitting layer, layers, such as a positive hole transporting layer, a positive hole injecting layer, an electron block layer, a positive hole block layer, an electron transporting layer, or an electron pouring layer. Among the layers, the positive hole injecting layer is formed with HI-406 (manufactured by Idemitsu Kosan, Co., Ltd.), CuPc (copper phthalocyanine) or the like, the electron transporting layer is formed with α-NPD(N,N'-di(1-naphthyl)-N, N'-diphenyl-1,1'-biphenyl-4,4'-diamine) or the like, the positive hole transporting layer is formed with an aluminum-quinolinol complex (Alq3) or the like, and the electron pouring layer is formed with LiF or the like.

In this embodiment, the electron transporting layer and the electron pouring layer of the light emitting functional layers 20 are formed in common irrespective of the difference in each of the light emitting elements 2R, 2G, and 2B. Thus, the electron transporting layer and the charge electron layer have uniform thickness on the substrate 10. FIG. 1 specially shows that only an electron transporting layer 201 is common to each of the light emitting functional layers 20R, 20G, and 20B. The electron pouring layer is formed in the upper side of FIG. 1 of the electron transporting layer 201 (i.e., between the electron transporting layer 201 and the second electrode layer 22) but the thickness is usually very small. Thus, the electron pouring layer is not shown. The effects obtained by such a structure will be described later.

The second electrode layer (translucent half-reflective layer) 22 is formed with, for example, an alloy, such as MgAl, MgCu, MgAu, or MgAg or metal materials. In this embodiment, the second electrode layer 22 is a common electrode provided in common to two or more pixels (light emitting elements) and is, for example, a cathode.

The second electrode layer 22 has a uniform thickness irrespective of the color of the emitted lights of the light emitting elements 2. More specifically, the second electrode layer 22 preferably has a thickness of about 5 to 20 [nm]. Since the thickness is relatively small, the second electrode layer 22 has translucent half-reflectivity.

Such a second electrode layer 22 transmits some of lights that have proceeded from the light emitting functional layers 20 (including lights from the light emitting functional layers 20) to the upper side of FIG. 1, and reflects the remaining lights to the lower side of FIG. 1, i.e., the first electrode layer 18.

In openings (pixel openings) formed between the two or more separators 16, the light emitting functional layer 20 contacts the first electrode layer 18. When a current flows between the first electrode layer 18 and the second electrode layer 22 in a certain light emitting element 2, a positive hole is supplied to the light emitting functional layer 20 in the light emitting element 2 from the first electrode layer 18 and an electron is supplied from the second electrode layer 22. When these positive holes and electrons re-join to generate an exciton, and the exciton transits to a ground state, energy release, i.e., a light emitting phenomenon, arises. Thus, the light emitting regions of the light emitting elements 2 are almost defined by the pixel openings formed between the separators 16. More specifically, the pixel openings of the separators 16 divide the light emitting elements 2.

To the light emitting panel 3, the color filter panel 30 is bonded with a transparent adhesive 28. The color filter panel 30 has a substrate 32 formed with transparent materials, such as glass, black matrices 34 formed on the substrate 32, and color filters 36 (36R, 36G, and 36B) disposed at openings formed in the black matrix 34.

The adhesive 28 supports both the color filter panel 30 and the light emitting panel 3 so that the substrate 32 and the color filters 36 in the color filter panel 30 and each layer of the light emitting panel 3 maintain an almost parallel state.

The color filters 36 each are disposed in such a manner as to be overlapped with the light emitting elements 2, particularly the first electrode layers 18. The color filters 36 each are disposed opposite to the light emitting functional layers 20 with the translucent half-reflective second electrode layer 22 interposed therebetween, and reflect light which has transmitted through the second electrode layer 22 of the over-lapped light emitting element 2.

The color filter 36R is overlapped with the light emitting element 2R, and one color filter 36R and one light emitting element 2R constitute one set. The color filter 36R has a function of transmitting a red light, and the transmittance peak appears at the wavelength of 610 nm. The color filter 36R transmits a red light among lights, which have transmitted the second electrode layer 22 of the overlapped light emitting element 2R and in which the red color has been amplified, to increase the red color purity. The color filter 36R absorbs most green lights and blue lights.

The remaining color filters 36G and 36B are basically the same as the color filter 36R described above although there is a difference in that color filters 36G and 36B transmit a green light and a blue light, respectively. The transmittance peak of each of the color filters 36G and 36B appears at the wavelength of 550 nm and 470 nm, respectively.

Light Reflection and Transmission Model

Figure 2:
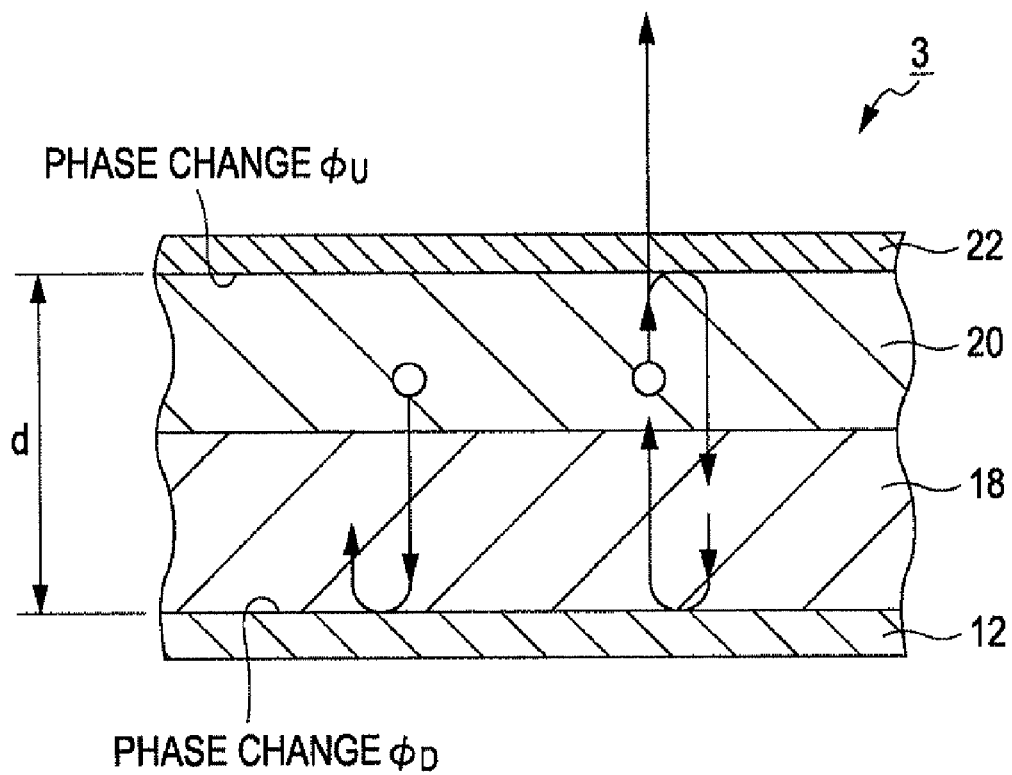
FIG. 2 is a schematic view briefly showing the light path in a resonator structure in the light emitting device of FIG. 1.

FIG. 2 is a schematic view briefly showing the path of the lights emitted from the light emitting functional layers 20. Some of the lights emitted from the light emitting functional layers 20 proceed to the first electrode layer 18 side, and reflects on the surface of the reflective layer 12 at the light emitting functional layer 20 side as shown in the left side of FIG. 2. The phase change in this reflection is defined as $\phi_D$. In contrast, the remaining lights proceed to the second electrode layer 22 side, and reflect on the surface of the second electrode layer 22 at the light emitting functional layer 20 side (interface facing the reflective layer 12 in the second electrode layer 22) as shown in the right side of FIG. 2. The phase change in this reflection is defined as $\phi_U$.

In the case of the latter case among the above cases, i.e., when the light reflects at the second electrode layer 22, the light transmits the light emitting functional layer 20 and the first electrode layer 18 after the reflection, and reflects again on the surface of the reflective layer 12 at the light emitting functional layer 20 side as shown in FIG. 2. Hereinafter, theoretically, the light reflection is infinitely repeated in the second electrode layer 22 and the reflective layer 12. Also in the case of the former case among the above cases, i.e., also when the light reflects in the reflective layer 12, the same applies although not shown.

In FIG. 2, the changes in the optical path due to the light refraction at each interface are not shown, and the optical path is shown by a simple straight line or curve line.

In this embodiment, the optical distance d shown in FIG. 2 (or FIG. 1) is defined by Equation (1) on the assumption that such a reflective phenomenon arises.

$$d = (2\pi m + \phi_D + \phi_U)(/4\pi) \cdot \lambda \tag{1}$$

Here, $\lambda$ is a wavelength [nm] set as a resonance target and m is an arbitrary integer. The meanings of $\phi_D$ and $\phi_U$ are as described above.

In this embodiment, $\lambda$ and d above are defined according to the difference in the light emitting elements 2R, 2G, and 2B as is also clear from FIG. 1. In this embodiment, particularly the light emitting element 2R corresponding to red color is an exception. This respect will be described after the description of the light emitting element 2R for green color and blue color.

More specifically, the light emitting elements 2G and 2B and the color filters 36G and 36B, respectively, constitute one set as described above. Thus, as the wavelength $\lambda$, the wavelength equivalent to the transmittance peak of each of these color filters 36G and 36B (i.e., $\lambda_G$=550 nm and =470 nm as described above) can be set (or substituted). As the optical distance d, $d_G$ and $d_B$ corresponding to $\lambda_G$ and $\lambda_B$, respectively, are determined (FIG. 1). In equation solving of $d_G$ and $d_B$, values ($\phi D = \phi_{DG}$, $\phi_{DB}$ or $\phi_U = \phi_{UG}$, $\phi_{UB}$) corresponding to $\lambda_G$ and $\lambda_B$, respectively, are used as $\phi_D$ and $\phi_U$ in Equation (1).

In order to realize $d_G$ and $d_B$ determined by Equation (1) on an actual device, the thickness of the light emitting functional layers 20G and 20B (particularly the thickness of the positive hole injecting layer (not shown) as a part thereof) is adjusted in each light emitting element 2 (2G and 2B) as shown in FIG. 1 in this embodiment.

In general, the "optical distance" of a certain substance is represented as the product of the physical thickness and the refractive index of the substance. Thus, when the physical thickness of the positive hole injecting layer is defined as t and the refractive index thereof is set as $n_{HIL}$, the total optical distance D of the positive hole injecting layer, the other light emitting functional layers 20, and the first electrode layer 18 is represented by:

$$D = t \cdot n_{HIL} + D_{20} + D_{18} \tag{2}$$

$D_{20}$ represents the optical distance of the light emitting functional layers 20 other than the positive hole injecting layer and $D_{18}$ represents the optical distance of the first electrode layer 18.

In Equation (2), $n_{HIL}$ cannot be basically changed. Thus, in order to establish either $D=d_G$ or $D=d_B$, t needs to be fluctuated. Thus, $t_G$ in the case of $D=d_G$ and $t_B$ in the case of $D=d_B$ can be determined. Then, the thickness of the positive hole injecting layer, i.e., the thickness of the light emitting functional layer 20, is adjusted based on the $t_G$ and $t_B$. In equation solving of $t_G$ and $t_B$, the values ($n_{18}=n_{HIL}$ G, $n_{HIL}$ B) corresponding to $\lambda_G$ and $\lambda_B$, respectively, are used as $n_{HIL}$ in Equation (2).

Thus, in this embodiment, the optical distance relating to an optical resonator is adjusted through the adjustment of the thickness of the positive hole injecting layer or the light emitting functional layer 20, but the invention is not limited to the structure. For example, in place of or in addition to the adjustment of the thickness of the light emitting functional layer 20, the optical distance relating to an optical resonator may be adjusted through the adjustment of the thickness of the first electrode layer 18.

As described above, in this embodiment, an optical resonator is constituted by the light emitting functional layer 20, the reflective layer 12, and the second electrode layer 22. More specifically, by repeated reflection of the lights emitted from the light emitting functional layer 20 between the reflective layer 12 and the second electrode layer 22, only a light having a certain specific wavelength components is subjected to amplification interference or involved in a resonance phenomenon.

For example, in the light emitting element 2G, the optical distance $d_G$ is defined by Equation (1) above. Thus, in the light emitting element 2G, a resonance phenomenon for a light having the wavelength $\lambda_G$ arises. Some of the lights (i.e., green light) having the wavelength $\lambda_G$ amplified as described above proceed to the outside of the device (refer to the arrow upwardly extending passing through the second electrode layer 22 in FIG. 2) because the second electrode layer 22 has semi-transmission ability. Thus, a green color is emphasized.

The same similarly arises in a blue color.

In this embodiment, the light emitting element 2R corresponding to red color is specially treated in this embodiment as previously described above.

In the light emitting element 2R corresponding to red color, the optical distance is not defined by Equation (1) or Equation (2). The optical distance $d_R$ is determined by:

$$d_R = (\phi D + \phi U) \cdot (/4\pi) \lambda \tag{3}$$

The thickness $t_R$ of the positive hole injecting layer constituting the light emitting element 2R is determined by:

$$d_R = t_R \cdot n_{HIL} + D_{20} + D_{18} \tag{4}$$

In these equations above, $\lambda = \lambda_R = 610$ nm, $\phi_D = \phi_{DR}$, $\phi_U = \phi_{UR}$, and $n_{HIL} = n_{HIL\ R}$. The meanings thereof are the same as in the case of the green color and the blue color described above.

As a result, the light emitting element 2R corresponding to red color does not satisfy the resonance conditions represented by Formula (1). More specifically, in the light emitting element 2R, the resonance phenomenon does not arise in the same meaning as in the case of the light emitting elements 2G and 2B described above.

When the thickness of the light emitting functional layer 20R of the light emitting element 2R is defined by Equation (3) or the like, the thickness generally becomes smaller than the thickness of the light emitting functional layers 20G and 20B of the light emitting elements 2G and 2B (refer to comparison of Equation (1) and Equation (3)). FIG. 1 shows such a situation. In usual, when the thickness of the light emitting functional layers 20R and 20B of both the red and blue light emitting elements 2R and 2B is determined in such a manner as to satisfy primary resonance conditions (i.e., when m in Equation (1) is 1) in both the light emitting elements, the thickness of the light emitting functional layer 20R must become larger than the thickness of the light emitting functional layer 20B but, in this embodiment, conversely, the former becomes smaller than the latter. This can be referred to as one of the features in this embodiment.

Effects of organic EL device

Hereinafter, the effects of the organic EL device 1 having the above-described structure will be described with reference to FIGS. 3 to 8 in addition to FIGS. 1 and 2 already referred to.

Figure 3:
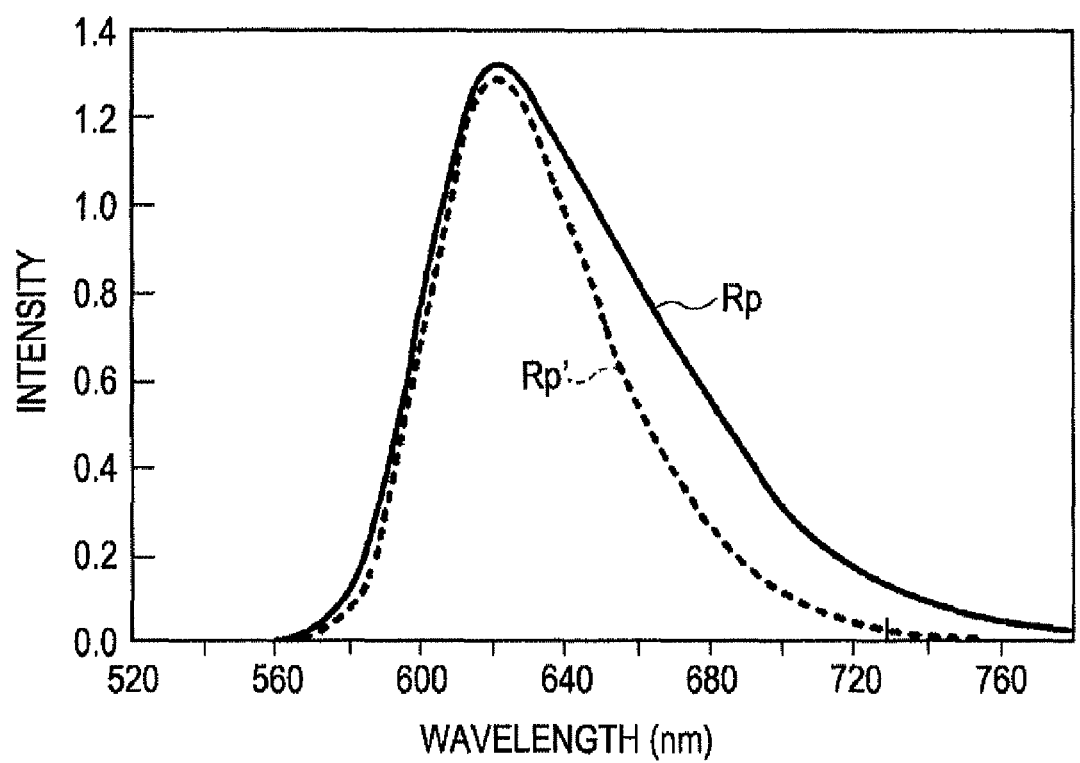
FIG. 3 is a view showing the experimental results of the spectrum of a red light emitted from the light emitting device of FIG. 1.

First, FIG. 3 and FIG. 4 represent various experimental results, such as observation results and the like of the intensity of lights observed in the actually manufactured organic EL device 1 having the structure described above. In this experiment, the following assumptions are established.

(i) The reflective layer 12 is formed with APC and the thickness thereof is 100 [nm]. The APC is an alloy containing Ag, Pd, and Cu (0.9% by weight of Pd, 1% by weight of Cu, and the balance Ag).

(ii) The first electrode layer 18 is formed with an ITO. The thickness thereof is 20 [nm].

(iii) The total thickness of the light emitting functional layers 20R, 20G, and 20B is 100 [nm], 226 [nm], and 201 [nm], respectively. The thickness includes the thickness of the positive hole transporting layer of 30 [nm], the thickness of the light emitting layer of 20 [nm], the thickness of the electron transporting layer of 32 [nm], and the thickness of the electron pouring layer of 1 [nm]. The same applies to all of the light emitting functional layers 20R, 20G, and 20B.

The thickness of the positive hole injecting layer is defined based on Equation (1), Equation (3), or the like, The positive hole injecting layer in the light emitting functional layer 20R is 17 [nm] and the positive hole injecting layers in the light emitting functional layers 20G and 20B are 143 [nm] and 118 [nm], respectively.

The materials constituting the light emitting layer are also different according to the difference in the light emitting functional layers 20R, 20G, and 20B. The light emitting layer corresponding to red color is constituted by doping a red dopant material Ir(piq)3 (manufactured by Idemitsu Kosan, Co., Ltd.) to a host material BAlq (manufactured by Idemitsu Kosan, Co., Ltd.), the light emitting layer of corresponding to green color is constituted by doping a green dopant material GD-206 (manufactured by Idemitsu Kosan, Co., Ltd.) to a host material BH-215 (manufactured by Idemitsu Kosan, Co., Ltd.), and the light emitting layer corresponding to blue color is constituted by doping a blue dopant material BD-102 (manufactured by Idemitsu Kosan, Co., Ltd.) to a host material BH-215 (manufactured by Idemitsu Kosan, Co., Ltd.).

(iv) The second electrode layer 22 is formed with MgAg. The thickness thereof is 10 [nm].

Under the above-described assumptions, the results of actually measuring the spectrum of the light emitted to the outside of the device from the light emitting element 2R corresponding to red color are shown in FIG. 3. In FIG. 3, the solid line represents the results of reflecting the above-described assumptions and the dashed line represents a comparative example thereof. Here, the comparative example represents the results obtained by performing the same experiment in a light emitting element in which the thickness of the light emitting functional layer 20R (refer to (iii) above) is determined in such a manner as to satisfy the resonance conditions represented by Equation (1) similarly as in the light emitting elements 2G and 2B corresponding to green color and a blue color, respectively, while not exceptionally dealing the light emitting element 2R corresponding to red color (Thickness of the positive hole injecting layer in this case: 174 [nm]). In the description below, the solid line in FIG. 3 is referred to as a red curve Rp and the dashed line is referred to as a red comparative example curve Rp'.

According to FIG. 3, the sharpness of the peak decreases as is clear from the change to the red curve Rp from the red-comparative example curve Rp'. More specifically, the half width increases. The direction of the increase in the half width occurs at the long wavelength side. Thus, the color purity relating to the red curve Rp is hardly different from the color purity relating to the red-comparative example curve Rp'.

In contrast, FIG. 4 shows the changes in the coordinate values on the chromaticity diagram of the "red" of the experimental example and the "red" of the comparative example according to changes in the viewing angle θ, and there arises no significant difference between them. The changes are smaller in those of the experimental example. For example, the changes in the coordinate values on the chromaticity diagram when the viewing angle changes from 0° to 75° are −0.035 in the x coordinate and +0.034 in the y coordinate in the comparative example and, in contrast, −0.012 in the x coordinate and +0.012 in the y coordinate in the experimental example.

The same applies to the changes in the peak wavelength. For example, the changes in the observation peak wavelength when the viewing angle changes from 0° to 75° are −11.7 [m] in the comparative example and, in contrast, −5.3 [m] in the experimental example.

FIG. 4 shows the changes in the standardized luminance of the experimental example and the comparative example according to the changes in the viewing angle θ, and shows that a reduction in the luminance is smaller in the experimental example than in the comparative example. For example, the changes in the standardized luminance when the viewing angle changes from 0° to 75° are −0.950 in the comparative example and, in contrast, −0.855 in the experimental example. The comparison in the standardized luminance between the experimental example and the comparative example particularly when the viewing angles θ are 45° and 60° shows that the superiority of the experimental example is conspicuous. In the experimental example, a reduction thereof is hardly observed (1.000 (in the case of 0°)→0.696 (in the case of) 45°) and, in contrast, a relatively sharp reduction thereof is observed in the comparative example (1.000 (in the case of °)→0.528 (in the case of 45°)).

The changes described above relate to the above-described differences between the experimental example and the comparative example, i.e., the fact that the light emitting element 2R corresponding to red color does not satisfy Equation (1).

As described above, the organic EL device 1 according to this embodiment constitutes a resonator based on the establishment of Equation (1). However, in this embodiment, only the light emitting elements 2G and 2B corresponding to green color and a blue color, respectively, completely enjoy the effects of the resonator. The light emitting element 2R corresponding to red color does not completely enjoy the effects of the resonator due to the optical distance $d_R$ satisfying Equation (3) above. In contrast, in this embodiment, the viewing angle characteristics of the light emitting element 2R corresponding to red color are sharply improved for the same reason. The specific situation is as described above with referring to FIG. 4.

In general, when an optical resonator based on the establishment of Equation (1) is constituted, the intensity of a light having a specific wavelength to be increased becomes high but there are disadvantages in that the directivity of the light increases and the viewing angle characteristics deteriorate. However, the green light and the blue light relatively easily enjoy the optical extraction efficiency improvement effect and the color purity improvement effect, and the deterioration of the viewing angle characteristics as the disadvantage thereof is not conspicuous. However, the same does not always apply to the red light. A phenomenon in which the spectrum shifts to the short wavelength side occurs as the viewing angle tilts from the front. In the green color or the blue color, when the spectrum shifts to the short wavelength side, the spectrum is away from the peak of the spectral luminous efficacy of 555 nm, and thus the viewing angle characteristics are not conspicuous. In the red color, when the spectrum shifts to the short wavelength side, the spectrum is close to the peak of the spectral luminous efficacy of 555 nm, and thus the viewing angle characteristics are conspicuous. More specifically, in the red color, the improvement of the optical extraction efficiency and the improvement of the color purity can be expected to some extent, but the effects are not so high but the deterioration of the viewing angle characteristics exceeding the effects is conspicuous (FIG. 3).

In this embodiment, the optical distance $d_R$ satisfying Equation (3) is given to the light emitting element 2R corresponding to red color in consideration of such a situation. Thus, in the light emitting element 2R corresponding to red color according to this embodiment, the viewing angle characteristics are still improved while maintaining the optical extraction efficiency or the color purity in an almost fixed degree. The reason for the fact that the optical extraction efficiency in an almost fixed degree can be maintained although Equation (1) is not satisfied resides in the fact that the optical distance of the light emitting element 2R corresponding to red color is determined to satisfy Equation (3), i.e., determined in such a manner as to satisfy the 0th resonance conditions (Equation (3) may be compared with Equation (1) when m in Equation (1) is 0).

In addition, in this embodiment, only the second electrode layer 22 corresponding to the light emitting element 2R is not completely made transparent so as not to generate the resonance phenomenon in the light emitting element 2R corresponding to red color, in spite of obtaining such effects. Moreover, it is not necessary to separately form an electron transporting layer 201 for the light emitting element 2R corresponding to red color (The peak wavelengths of the red light and the blue light are greatly different from each other. Thus, when an optical resonator relating to lights of both the colors is constituted, the film thickness of the electron transporting layer 201 is made different according to the difference in both the colors from the viewpoint of optical extraction efficiency.). As previously described above, in this embodiment, the second electrode layer 22 and the electron transporting layer 201 are also formed in common in all the light emitting elements 2.

Thus, in this embodiment, there is no room for a defect such that a manufacturing process becomes particularly complicated. As the background for enjoying such an effect, the fact that the optical distance of the light emitting element 2R corresponding to red color is set to satisfy Equation (3) is mentioned. More specifically, this is because, in this embodiment, a kind of resonance phenomenon is produced in the light emitting element 2R although it is non-resonant and this embodiment is not based on the idea that non-resonance is simply achieved (the necessity of making the second electrode layer 22 transparent or the like arises when this embodiment is based on the idea).

In the above, the embodiment according to an aspect of the invention is described, but the light emitting device according to the aspect of the invention is not limited to the above-described structure and can be variously modified. (1) Although the embodiment described above describes the case where the light emitting functional layer 20 emits each light, the invention is not limited to the structure.

For example, the light emitting functional layer may be also formed in common irrespective of the difference in the light emitting elements 2R, 2G, and 2B similarly as the fact that the first electrode layer 18 of the embodiment is formed in common irrespective of the difference in the light emitting elements 2R, 2G, and 2B. In this case, the light emitting functional layer is one emitting a white light, for example. Even in such a case, when the optical resonator structure corresponding to each color described above is employed for each of the light emitting elements 2, the wavelength components of a light having a specific color (e.g., a red light, a green light, and a blue light as in the embodiment) among the white light can be emphasized and extracted to the outside.

(2) In the embodiment described above, the experimental example on the assumptions of (i) to (iv) above is described in the experimental example, but it is a matter of course that the invention is not necessarily restricted to the assumptions.

(3) In the embodiment described above, the optical distance of the light emitting element 2R corresponding to red color is determined in such a manner as to satisfy Equation (3), but the invention is not limited to the structure. In this respect, when the conditions are satisfied, there surely arises the advantage in that the defect such that a manufacturing process becomes complicated does not arise as described above. However, a core point of the invention resides in the fact that the resonance conditions are not satisfied in the light emitting element corresponding to red color or the resonator structure is not given to the light emitting element as is clear from the above description. Thus, leaving measures aside, an aspect such that the above-described structure is specifically achieved is within the scope of the invention. As the measures, a measure for making only the second electrode layer corresponding to the light emitting element corresponding to red color transparent or the like (in other words, a measure for separately manufacturing the second electrode layer for a red color and the second electrode layer for a green color and a blue color), and the like can be specifically mentioned, for example.

Application

Next, an electronic device to which the light emitting device according to the invention is applied will be described.

Figure 5:
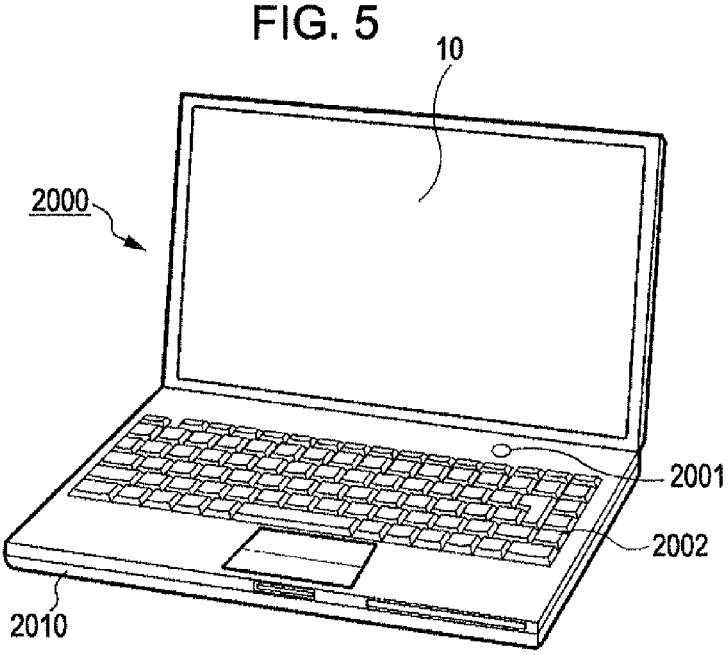
FIG. 5 is a perspective view showing an electronic device to which the light emitting device according to an aspect of invention is applied.

FIG. 5 is a perspective view showing the structure of a mobile personal computer utilizing the light emitting device according to the above-described embodiment for an image display device. A personal computer 2000 has the organic EL device 1 as a display device and a main body 2010. The main body 2010 is provided with a power switch 2001 and a keyboard 2002.

Figure 6:
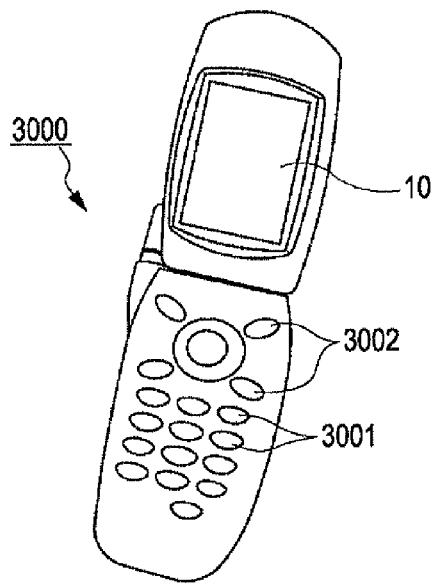
FIG. 6 is a perspective view showing another electronic device to which the light emitting device according to an aspect of the invention is applied.

FIG. 6 shows a cellular phone to which the light emitting device according to the embodiment is applied. A cellular phone 3000 has two or more operation buttons 3001, two or more scroll button 3002, and the organic EL device 1 as a display device. By operating the scroll buttons 3002, the screen to be displayed on the organic EL device 1 is scrolled.

Figure 7:
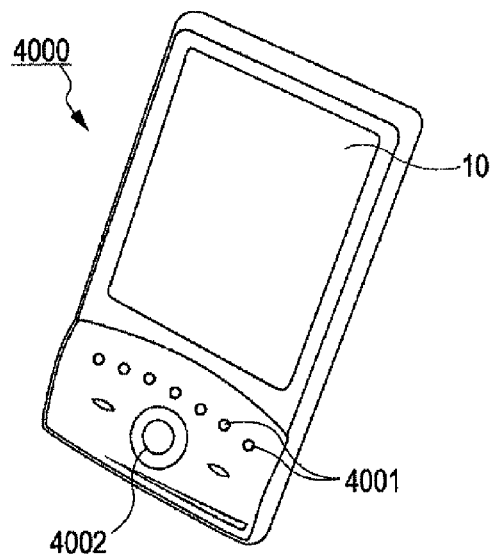
FIG. 7 is a perspective view showing a still another electronic device to which the light emitting device according to aspects of the invention is applied.

FIG. 7 shows a personal digital assistant (PDA) to which the light emitting device according to the embodiment is applied. A personal digital assistant 4000 has two or more operation buttons 4001, a power switch 4002, and the organic EL device 1 as a display device. By operating the power switch 4002, various kinds of information including an address book or a schedule book are displayed on the organic EL device 1.

Mentioned as electronic devices to which the light emitting device according to an aspect of the invention is applied are, in addition to the electronic devices shown in FIGS. 5 to 7, devices having a digital still camera, a television, a video camera, a car navigation device, a pager, an electronic notebook, electronic paper, a calculator, a word processor, a workstation, a TV phone, a POS terminal, a video player, a touch panel, and the like.

The entire disclosure of Japanese Patent Application No. 2009-246364, filed Oct. 27, 2009 is expressly incorporated by reference herein.

What is claimed is:

1. A light emitting device according, comprising:
A plurality of light emitting elements each having a first electrode layer, a second electrode layer, and a light emitting layer disposed between the first and the second electrode layers;
a reflective layer that reflects a light emitted by the light emitting layer to the light emitting layer; and
a translucent half-reflective layer disposed opposite to the reflective layer with the light emitting layer interposed therebetween, reflects some of lights emitted by light emitting layer to the light emitting layer, and transmits the remaining lights,
the light emitting elements including a red light emitting element that emits a red light, a green light emitting element that emits a green light, and a blue light emitting element that emits a blue light,
the optical distance from the reflective layer relating to the red light emitting element to the interface facing the reflective layer in the translucent half-reflective layer being defined based on $d_R$ calculated by Equation (i), $$d_R = (\phi_{DR} + \phi_{UR})/4\theta) \cdot \lambda_R \quad \text{(i)}$$

wherein
$\lambda_R$ represents a red light wavelength;
$\phi_{DR}$ represents a phase change when a light having a wavelength $\lambda_R$ that proceeds to the reflective layer from the light emitting layer side reflects on the reflective layer; and
$\phi_{UR}$ represents a phase change when a light having a wavelength $\lambda_R$ that proceeds to the translucent half-reflective layer from the light emitting layer side reflects on the translucent half-reflective layer.

2. The light emitting device according to claim 1, wherein the optical distance from the reflective layer relating to each of the green light emitting element and the blue light emitting element to the interface facing the reflective layer in the translucent half-reflective layer is defined based on d calculated by Equation (ii), $$D = (2\pi m + \phi_D + \phi_U)/4\pi) \cdot \lambda \quad \text{(ii)},$$

wherein
$\lambda$ represents a wavelength to be set as a resonance target;
$\phi_D$ represents a phase change when a light having a wavelength $\lambda$ that proceeds to the reflective layer from the light emitting layer side reflects on the reflective layer;
$\phi_U$ is a phase change when a light having a wavelength $\lambda$ that proceeds to the translucent half-reflective layer from the light emitting layer side reflects on the translucent half-reflective layer; and
m represents a positive integer.

3. A light emitting device, comprising:
A plurality of light emitting elements each having a first electrode layer, a second electrode layer, and a light emitting layer disposed between the first and the second electrode layers;
a reflective layer that reflects a light emitted by the light emitting layer to the light emitting layer; and
a translucent half-reflective layer disposed opposite to the reflective layer with the light emitting layer interposed therebetween, reflects some of lights emitted by light emitting layer to the light emitting layer, and transmits the remaining lights;
the light emitting elements including a red light emitting element that emits a red light, a green light emitting element that emits a green light, and a blue light emitting element that emits a blue light;
the optical distance from the reflective layer relating to the blue light emitting element to the interface facing the reflective layer in the translucent half-reflective layer being defined based on d calculated by Equation (iii); and
the optical distance from the reflective layer relating to the red light emitting element to the interface facing the reflective layer in the translucent half-reflective layer being set to be smaller than d, $$d = (2\pi + \phi_D + \phi_U)/4\theta) \cdot \lambda \quad \text{(iii)},$$

wherein
$\lambda$ represents a wavelength to be set as a resonance target;
$\phi_D$ represents a phase change when a light having a wavelength $\lambda$ that proceeds to the reflective layer from the light emitting layer side reflects on the reflective layer; and
$\phi_U$ represents a phase change when a light having a wavelength $\lambda$ that proceeds to the translucent half-reflective layer from the light emitting layer side reflects on the translucent half-reflective layer.

4. The light emitting device according to claim 1, further comprising an electron transporting layer disposed between the first and the second electrode layers, wherein
the electron-transporting layer and the second electrode layer are formed in common in all of the red light emitting element, the green light emitting element, and the blue light emitting element.

5. The light emitting device according to claim 1, wherein the translucent half-reflective layer contains the second electrode layer and functions as a cathode.

6. A light emitting device, comprising:
A plurality of light emitting elements each having a first electrode layer, a second electrode layer, and a light emitting layer disposed between the first and the second electrode layers, the light emitting elements including a red light emitting element that emits a red light, a green light emitting element that emits a green light, and a blue light emitting element that emits a blue light;
a reflective layer being disposed between a substrate and the first electrode layer and reflecting light emitted by the light emitting layer to the light emitting layer; and
the green light emitting element and the blue light emitting element each having a resonator structure which contains the reflective layer and a translucent half-reflective layer and which is constituted by adjustment of the optical distance between the reflective layer and the translucent half-reflective layer, the red light emitting element not having the resonator structure.

7. An electronic device, comprising the light emitting device according to claim 1.

* * * * *